US011081470B2

(12) United States Patent
Lee et al.

(10) Patent No.: US 11,081,470 B2
(45) Date of Patent: Aug. 3, 2021

(54) SEMICONDUCTOR DEVICE AND METHOD OF MANUFACTURING THEREOF

(71) Applicant: Amkor Technology Singapore Holding Pte. Ltd., Valley Point (SG)

(72) Inventors: Won Geol Lee, Seoul (KR); Won Chul Do, Bucheon-si (KR); Ji Hun Yi, Seoul (KR)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 0 days.

(21) Appl. No.: 16/680,388

(22) Filed: Nov. 11, 2019

(65) Prior Publication Data

US 2020/0219849 A1    Jul. 9, 2020

Related U.S. Application Data

(63) Continuation of application No. 15/445,568, filed on Feb. 28, 2017, now Pat. No. 10,475,770.

(51) Int. Cl.
| | |
|---|---|
| *H01L 25/065* | (2006.01) |
| *H01L 23/538* | (2006.01) |
| *H01L 25/00* | (2006.01) |
| *H01L 23/31* | (2006.01) |
| *H01L 23/498* | (2006.01) |

(52) U.S. Cl.
CPC ...... *H01L 25/0657* (2013.01); *H01L 23/3128* (2013.01); *H01L 23/5384* (2013.01); *H01L 23/5385* (2013.01); *H01L 23/5386* (2013.01); *H01L 23/5389* (2013.01); *H01L 25/50* (2013.01); *H01L 23/49811* (2013.01); *H01L 2224/04105* (2013.01); *H01L 2224/12105* (2013.01); *H01L 2224/16227* (2013.01); *H01L 2224/18* (2013.01); *H01L 2224/32145* (2013.01); *H01L 2224/73253* (2013.01); *H01L 2224/73267* (2013.01); *H01L 2225/06524* (2013.01); *H01L 2225/06548* (2013.01); *H01L 2225/06558* (2013.01); *H01L 2225/06582* (2013.01)

(58) Field of Classification Search
None
See application file for complete search history.

(56) References Cited

U.S. PATENT DOCUMENTS

| | | | |
|---|---|---|---|
| 7,847,413 B2 | 12/2010 | Akiba | |
| 10,002,857 B2 * | 6/2018 | Solimando | ............... H01L 21/54 |
| 10,475,770 B2 * | 11/2019 | Lee | ..................... H01L 23/5386 |

(Continued)

FOREIGN PATENT DOCUMENTS

| | | |
|---|---|---|
| KR | 1020100062315 | 6/2010 |
| KR | 1020120075855 | 7/2012 |
| KR | 101672622 | 11/2016 |

OTHER PUBLICATIONS

Notice of Preliminary Injunction of Korean International Application No. KR10-2017-0057521 dated May 8, 2017.

*Primary Examiner* — Long Pham
(74) *Attorney, Agent, or Firm* — McAndrews, Held & Malloy, Ltd.

(57) ABSTRACT

Various aspects of this disclosure provide a semiconductor device and a method of manufacturing a semiconductor device. As a non-limiting example, various aspects of this disclosure provide a semiconductor device comprising a stacked die structure and a method of manufacturing thereof.

20 Claims, 7 Drawing Sheets

(56) References Cited

U.S. PATENT DOCUMENTS

| | | |
|---|---|---|
| 10,510,733 B2 * | 12/2019 | Kumar ................... H01L 24/19 |
| 2006/0043573 A1 | 3/2006 | Hedler |
| 2008/0006947 A1 | 1/2008 | Kkiba et al. |
| 2009/0243065 A1 * | 10/2009 | Sugino ............... H01L 25/0657 |
| | | 257/686 |
| 2017/0084576 A1 | 3/2017 | Yu |
| 2017/0117251 A1 | 4/2017 | Khan |
| 2017/0294422 A1 * | 10/2017 | Solimando ............. H01L 25/50 |
| 2018/0247916 A1 * | 8/2018 | Lee ........................ H01L 25/50 |
| 2019/0004571 A1 * | 1/2019 | Sahu .................... H01L 23/147 |
| 2020/0083201 A1 * | 3/2020 | Suk .................... H01L 23/3128 |
| 2020/0219849 A1 * | 7/2020 | Lee .................... H01L 23/5389 |
| 2020/0303332 A1 * | 9/2020 | Chen ...................... H01L 24/19 |

\* cited by examiner

SEMICONDUCTOR DEVICE AND METHOD OF MANUFACTURING THEREOF

CROSS-REFERENCE TO RELATED APPLICATIONS/INCORPORATION BY REFERENCE

This patent is a continuation of U.S. patent application Ser. No. 15/445,568, filed Feb. 28, 2017, and titled "Semiconductor Device Having Stacked Dies and Stacked Pillars and Method of Manufacturing Thereof," expected to issue as U.S. Pat. No. 10,475,770, the entire contents of which are hereby incorporated herein by reference in its entirety.

BACKGROUND

Present semiconductor devices and methods for manufacturing semiconductor devices are inadequate, for example resulting in manufacturing processes that are too time-consuming and/or too costly, resulting in semiconductor packages with unreliable connections and/or interconnection structures having suboptimal dimensions, etc. Further limitations and disadvantages of conventional and traditional approaches will become apparent to one of skill in the art, through comparison of such approaches with the present disclosure as set forth in the remainder of the present application with reference to the drawings.

SUMMARY

Figure 1:
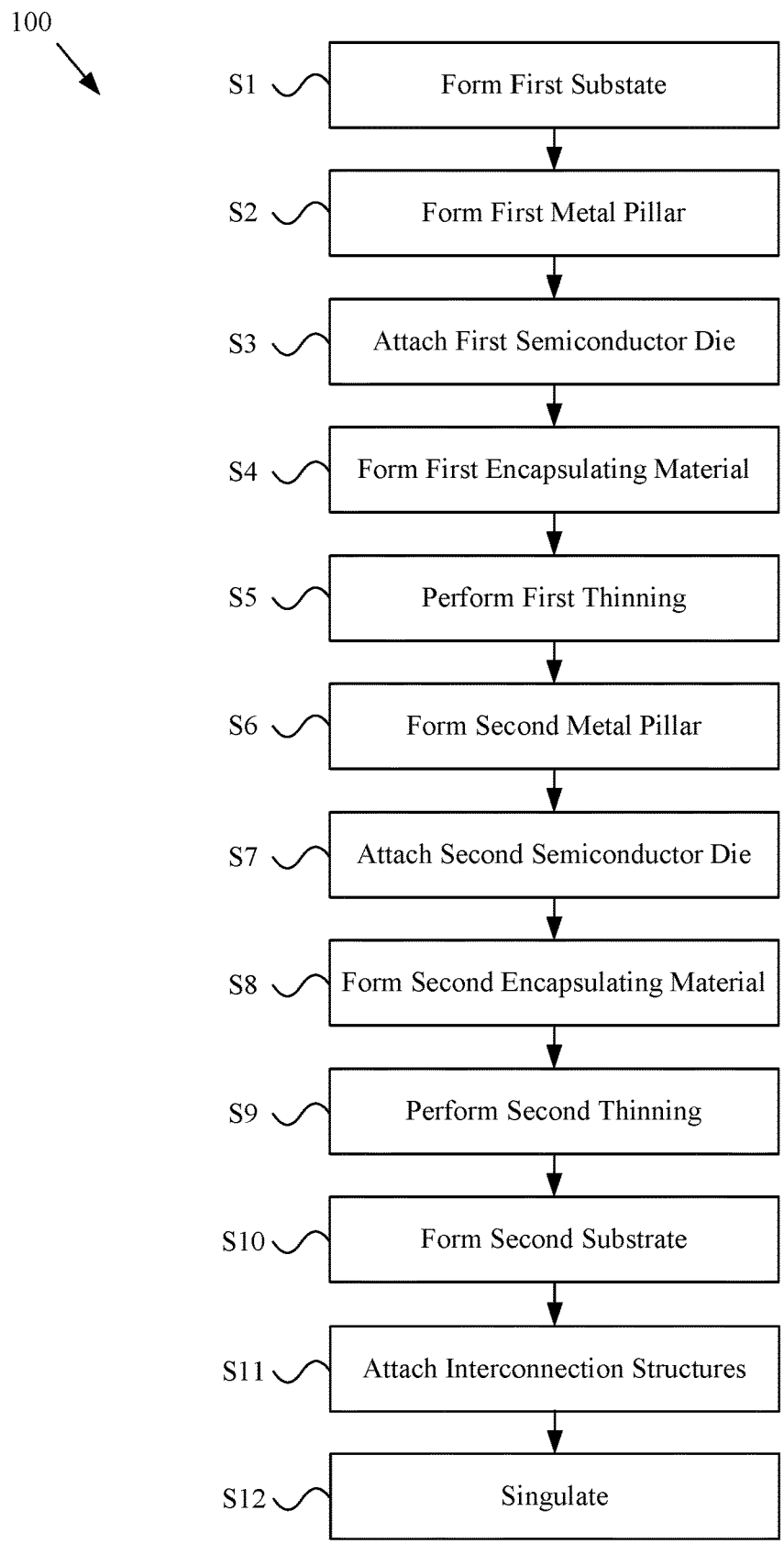
FIG. 1 shows a flow diagram of an example method of manufacturing a semiconductor device, in accordance with various aspects of the present disclosure.

Various aspects of this disclosure provide a semiconductor device and a method of manufacturing a semiconductor device. As a non-limiting example, various aspects of this disclosure provide a semiconductor device comprising a stacked die structure and a method of manufacturing thereof.

DETAILED DESCRIPTION OF VARIOUS ASPECTS OF THE DISCLOSURE

The following discussion presents various aspects of the present disclosure by providing examples thereof. Such examples are non-limiting, and thus the scope of various aspects of the present disclosure should not necessarily be limited by any particular characteristics of the provided examples. In the following discussion, the phrases "for example," "e.g.," and "exemplary" are non-limiting and are generally synonymous with "by way of example and not limitation," "for example and not limitation," and the like.

As utilized herein, "and/or" means any one or more of the items in the list joined by "and/or". As an example, "x and/or y" means any element of the three-element set {(x), (y), (x, y)}. In other words, "x and/or y" means "one or both of x and y." As another example, "x, y, and/or z" means any element of the seven-element set {(x), (y), (z), (x, y), (x, z), (y, z), (x, y, z)}. In other words, "x, y and/or z" means "one or more of x, y, and z."

The terminology used herein is for the purpose of describing particular examples only and is not intended to be limiting of the disclosure. As used herein, the singular forms are intended to include the plural forms as well, unless the context clearly indicates otherwise. It will be further understood that the terms "comprises," "includes," "comprising," "including," "has," "have," "having," and the like when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present disclosure. Similarly, various spatial terms, such as "upper," "above," "lower," "below," "side," "lateral," "horizontal," "vertical," and the like, may be used in distinguishing one element from another element in a relative manner. It should be understood, however, that components may be oriented in different manners, for example a semiconductor device may be turned sideways so that its "top" surface is facing horizontally and its "side" surface is facing vertically, without departing from the teachings of the present disclosure.

It will also be understood that terms coupled, connected, attached, and the like include both direct and indirect (e.g., with an intervening element) coupling, connecting, attaching, etc., unless explicitly indicated otherwise. For example, if element A is coupled to element B, element A may be indirectly coupled to element B through an intermediate signal distribution structure, element A may be directly coupled to element B (e.g., adhered directly to, soldered directly to, attached by direct metal-to-metal bond, etc.), etc.

In the drawings, the dimensions of structures, layers, regions, etc. (e.g., absolute and/or relative dimensions) may be exaggerated for clarity. While such dimensions are generally indicative of an example implementation, they are not limiting. For example, if structure A is illustrated as being larger than region B, this is generally indicative of an example implementation, but structure A is generally not required to be larger than structure B, unless otherwise indicated. Additionally, in the drawings, like reference numerals may refer to like elements throughout the discussion.

Along with a current trend toward smaller and thinner electronic products, it is generally desirable for semiconductor devices employed in such electronic products to have increased functionality and a reduced size. Such goals have resulted in the development of a variety of semiconductor packaging technologies. Examples of such packaging technologies include, PoP (Package-on-Package) configurations in which a semiconductor package is stacked on another package, a PiP (Package-in-Package) configurations in which a semiconductor package is mounted in another package, etc. Such packaging technologies, however, are generally associated with increased package (or device) thickness and relatively complex manufacturing processes, for example involving increased cycle time, increased cost, increased opportunity for defects, etc.

Various aspects of the present disclosure provide a semiconductor device, which may also be referred to herein as a semiconductor package, having a reduced overall thickness and that may facilitate stacking of semiconductor dies, and a fabricating method thereof.

Various aspects of the present disclosure provide a semiconductor device that includes: a first substrate, a first metal pillar on a first side of the first substrate; a first semiconductor die coupled to the first side of the first substrate; a second metal pillar on the first metal pillar; a second semiconductor die coupled to the first semiconductor die; a second substrate on the second metal pillar and on the second semiconductor die; and encapsulating material between the first substrate and the second substrate and encapsulating at least a side of each of the first metal pillar, the first semiconductor die, the second metal pillar and the second semiconductor die.

In various example implementations, the encapsulating material may, for example, include: a first encapsulating material that has a same height as the first metal pillar from the first substrate; and a second encapsulating material that has a same height as the second metal pillar from the second substrate. The first encapsulating material and the second encapsulating material may be formed of a same material. The first encapsulating material and the second encapsulating material may be formed of different materials. The first encapsulating material may, for example, have a greater height than that of the first semiconductor die from the first substrate and may encapsulate the first side of the first semiconductor die.

In various example implementations, the semiconductor device may, for example, include an adhesion member that couples the first and second semiconductor dies to each other. In an example implementation, the encapsulating material may include: a first encapsulating material that has a same height as the first metal pillar from the first substrate; and a second encapsulating material that has a same height as the second metal pillar from the second substrate and surrounds the adhesion member. The adhesion member may, for example, have a same height as the second encapsulating material from the second substrate.

In various example implementations, an active side of the first semiconductor die may be electrically coupled to an active side of the second semiconductor die through at least the first substrate, the first metal pillar, the second metal pillar, and the second substrate.

In various example implementations, the first metal pillar and the second metal pillar may be displaced from each other in a direction perpendicular to a stacking direction in which the first metal pillar and the second metal pillar are stacked; and the semiconductor device comprises a pillar redistribution structure electrically connecting the first metal pillar and the second metal pillar. The encapsulating material may, for example include: a first encapsulating material that has a same height as the first metal pillar from the first substrate; and a second encapsulating material between the first encapsulating material and the second substrate, wherein the pillar redistribution structure is over the first encapsulating material and at least a portion of the pillar redistribution structure is embedded in the second encapsulating material.

In various example implementations, the second semiconductor die may be displaced from the first semiconductor die in a direction perpendicular to a stacking direction in which the first semiconductor die and the second semiconductor die are stacked. Also, in various example implementations, there might be no intervening layers between the first and second metal pillars.

Various aspects of the present disclosure also provide a semiconductor device that includes: a first substrate; a first metal pillar plated on a first side of the first substrate; a first semiconductor die comprising: a first side facing away from the substrate; and a second side facing the substrate, and comprising pads that are connected to the first side of the substrate with conductive bumps; a second metal pillar plated on the first metal pillar; a second semiconductor die comprising: a first side facing away from the first semiconductor die and comprising pads; and a second side coupled to the first side of the first semiconductor die; a second substrate comprising: a first side facing away from the second semiconductor die; and a second side facing the first semiconductor die and comprising a conductive layer connected to the die pads of the second semiconductor die; and encapsulating material between the first substrate and the second substrate and encapsulating at least lateral sides of the first metal pillar, the first semiconductor die, the second metal pillar and the second semiconductor die.

In various example implementations, the encapsulating material may include: a first encapsulating material that has a same height as the first metal pillar from the first substrate; and a second encapsulating material that extends entirely between the first encapsulating material and the second substrate.

In various example implementations, the semiconductor device may comprise an adhesion member that couples the first and second semiconductor dies to each other. The encapsulating material may, for example, include: a first encapsulating material; and a second encapsulating material that has a same height as the adhesion member from the second substrate.

In various example implementations, the second metal pillar may be plated directly on the first metal pillar. In various example implementations, the semiconductor device may comprise a pillar redistribution structure through which the first metal pillar and the second metal pillar are electrically connected.

Various aspects of the present disclosure provide a method of manufacturing a semiconductor device, where the fabricating method includes: providing a first substrate; forming a first metal pillar on a first side of the first substrate; coupling a first semiconductor die to the first side of the first substrate; forming a second metal pillar on the first metal pillar; coupling a second semiconductor die to the first semiconductor die; forming a second substrate on the second metal pillar and on the second semiconductor die; and forming an encapsulating material between the first substrate and the second substrate that encapsulates at least a side of each of the first metal pillar, the first semiconductor die, the second metal pillar and the second semiconductor die.

Various aspects of the present disclosure will now be described in detail with reference to the accompanying drawings such that they may be readily practiced by those skilled in the art.

FIG. 1 shows a flow diagram of an example method 100 of manufacturing a semiconductor device, in accordance with various aspects of the present disclosure. FIGS. 2A-2J show cross-sectional views of an example semiconductor device during manufacturing in accordance with the example method 100 of FIG. 1. The following discussion will generally refer to FIG. 1 and FIGS. 2A-2J together.

Referring to FIG. 1, the example method 100 of manufacturing a semiconductor device may comprise: (S1) forming a first substrate, (S2) forming a first metal pillar, (S3) attaching a first semiconductor die, (S4) forming a first encapsulating material, (S5) performing a first thinning, (S6) forming a second metal pillar, (S7) attaching a second semiconductor die, (S8) forming a second encapsulating material, (S9) performing a second thinning, (S10) forming a second substrate, (S11) attaching interconnection structures, and (S12) singulating. Various blocks (or steps, stages, processes, etc.) of the example method 100 illustrated FIG. 1 will be now be described with reference to FIGS. 2A-2J.

Figure 2A:
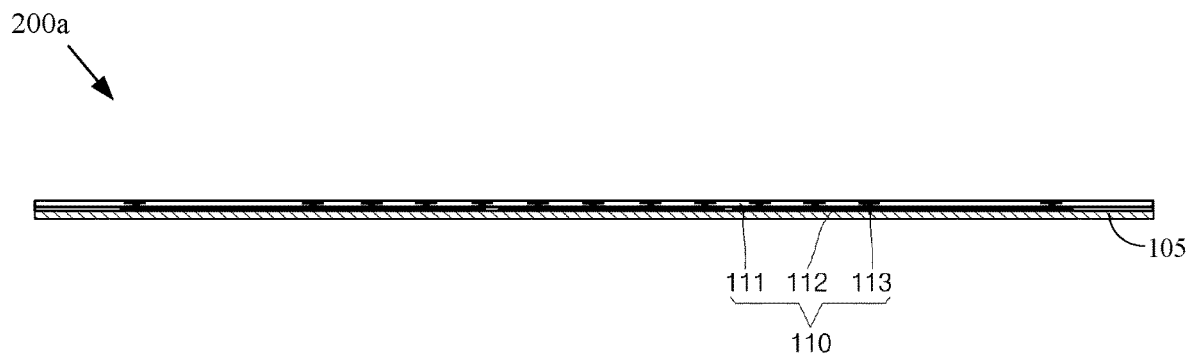
FIGS. 2A to 2J show cross-sectional views illustrating various steps of a method of manufacturing a semiconductor device, in accordance with various aspects of the present disclosure.

Referring to FIG. 1 and the example structure 200a of FIG. 2A, the example method 100 may, at block S1, comprise forming (or providing, receiving, etc.) a carrier 105 and forming a first substrate 110 on the carrier 105. The carrier 105 may comprise any of a variety of characteristics, non-limiting examples of which are provided herein. The carrier 105 may, for example, comprise a carrier for a single semiconductor device (or package) or may, for example, comprise a wafer or panel on which any number of semiconductor devices (or packages) may be formed. The carrier 105 may, for example, comprise a semiconductor wafer or panel. The carrier 105 may also, for example, comprise a glass wafer or panel, a metal wafer or panel, a ceramic wafer or panel, a plastic wafer or panel, etc.

In an example scenario, the carrier 105 may be received with the first substrate 110 already formed thereon. In such a scenario, the first substrate 110 need not be formed at block S1. In another example scenario, the carrier 105 may be received without the first substrate 110 (or a portion thereof) formed thereon, and block S1 may comprising forming the first substrate 110 (or a remaining portion) thereon. Note that the first substrate 110 may also be referred to herein as an interposer.

Block S1 may, for example, comprise forming the first substrate 110 having any number of dielectric layers and conductive layers (e.g., signal distribution layers, pad layers, conductive vias, underbump metallization, etc.). In an example implementation, a first substrate 110 comprising a signal distribution layer 112, a dielectric layer 111, and a pad (or via) layer 113 may be formed on the carrier 105.

The signal distribution layer 112, which may also be referred to herein as a redistribution layer, a distribution layer, a conductive layer, a trace layer, etc., may comprise any of a variety of materials (e.g., copper, aluminum, nickel, iron, silver, gold, titanium, chromium, tungsten, palladium, combinations thereof, alloys thereof, equivalents thereof, etc.), but the scope of the present disclosure is not limited thereto. The signal distribution layer 112 (or first substrate 110) may, for example, provide electrical signal pathways between terminals of the first semiconductor die 130 and respective first metal pillars 120.

Block S1 may comprise forming the signal distribution layer 112 in any of a variety of manners, non-limiting examples of which are presented herein. For example, block S1 may comprise forming the signal distribution layer 112 utilizing any one or more of a variety of processes (e.g., electrolytic plating, electroless plating, chemical vapor deposition (CVD), metal organic chemical vapor deposition (MOCVD), sputtering or physical vapor deposition (PVD), atomic layer deposition (ALD), plasma vapor deposition, printing, screen printing, lithography, etc.), but the scope of the present disclosure is not limited thereto. The signal distribution layer 112 may, for example, be formed directly on the carrier 105, on an intervening dielectric layer, etc.

In various example scenarios, for example in which the signal distribution layer 112 is electroplated, block S1 may comprise forming one or more seed layers prior to electroplating the signal distribution layer 112. For example, though not shown in FIG. 2A, block S1 may comprise forming one or more seed layers on the top surface of the carrier 105. Such seed layer(s) may comprise any of a variety of materials. For example, the seed layer(s) may comprise copper. Also for example, the seed layer(s) may comprise one or more layers of any of a variety of metals (e.g., silver, gold, aluminum, tungsten, titanium, nickel, molybdenum, etc.). The seed layer(s) may be formed utilizing any of a variety of techniques (e.g., sputtering or other physical vapor deposition (PVD) technique, chemical vapor deposition (CVD), electroless plating, electrolytic plating, etc.). The seed layer(s) may, for example, be utilized during a subsequent electroplating process.

Note that in various example implementations, the carrier 105 may be provided (or formed) having an oxide and/or nitride layer (or other dielectric material) thereon, in which case block 105 may comprise removing such layer prior to forming the substrate 110, forming the substrate 110 on such layer, forming another layer on the carrier 105 prior to forming the substrate 110, etc.

The dielectric layer 111 may comprise one or more layers of any of a variety of dielectric materials, for example inorganic dielectric materials (e.g., $Si_3N_4$, $SiO_2$, SiON, SiN, oxides, nitrides, combinations thereof, equivalents thereof, etc.) and/or organic dielectric materials (e.g., a polymer, polyimide (PI), benzocyclobutene (BCB), polybenzoxazole (PBO), bismaleimide triazine (BT), a molding material, a phenolic resin, an epoxy, silicone, acrylate polymer, combinations thereof, equivalents thereof, etc.), but the scope of the present disclosure is not limited thereto.

Block S1 may comprise forming the dielectric layer 111 utilizing any one or more of a variety of processes (e.g., spin coating, spray coating, printing, sintering, thermal oxidation, physical vapor deposition (PVD), chemical vapor deposition (CVD), atomic layer deposition (ALD), low pressure chemical vapor deposition (LPCVD), plasma enhanced chemical vapor deposition (PECVD), plasma vapor deposition (PVD), sheet lamination, evaporating, etc.), but the scope of the present disclosure is not limited thereto.

Block S1 may, for example, also comprise patterning the dielectric layer 111, for example forming apertures therein that expose various portions of various conductive layers discussed herein (e.g., the signal distribution layer 112, other signal distribution layers, conductive layers, pad layers, etc.). For example, block S1 may comprise ablating apertures (e.g., utilizing laser ablation, utilizing mechanical ablation, utilizing etching, etc.). Also for example, block S1 may comprise originally forming the dielectric layer 111 (e.g., depositing, etc.) having the desired apertures.

The pad (or via) layer 113, which may also be referred to herein as a pad, a via, a trace, a land, a bond pad layer, a conductive layer, a trace layer, etc., may comprise any of a variety of materials (e.g., copper, aluminum, nickel, iron, silver, gold, titanium, chromium, tungsten, palladium, combinations thereof, alloys thereof, equivalents thereof, etc.), but the scope of the present disclosure is not limited thereto.

Block S1 may comprise forming the pad (or via) layer 113 in any of a variety of manners, non-limiting examples of which are presented herein. For example, block S1 may comprise forming the pad layer 113 utilizing any one or more of a variety of processes (e.g., electrolytic plating, electroless plating, chemical vapor deposition (CVD), metal organic chemical vapor deposition (MOCVD), sputtering or physical vapor deposition (PVD), atomic layer deposition (ALD), plasma vapor deposition, printing, screen printing, lithography, etc.), but the scope of the present disclosure is not limited thereto. Block S1 may, for example, comprise forming the pad layer 113 on portions of the signal distribution layer 112 exposed by apertures in the dielectric layer 111, on portions of the dielectric layer 111, etc.

As with the signal distribution layer 112 or any conductive layer discussed herein, block S1 may comprise forming one or more seed layers as part of the processing of forming the pad (or via) layer 113 (e.g., prior to electroplating the pad layer 113, etc.). For example, though not shown in FIG. 2A, block S1 may comprise forming one or more seed layers on the top surface of the signal distribution layer 112, on a top surface and/or aperture surfaces of the dielectric layer 111, etc.

Note that although an illustrative set of conductive layers and dielectric layers is shown in the drawings, block S1 may comprise forming the first substrate 110 to have any number of such conductive and/or dielectric layers.

As discussed herein, the carrier 105 may comprise a silicon (or other semiconductor) wafer. In such case, the signal distribution layer 112, the dielectric layer 111, and the pad (or via) layer 113 may be formed in a semiconductor wafer fabrication process (e.g., at a wafer fab facility, etc.). Also for example, any or all of such layers may be formed in a packaging process (e.g., at a semiconductor device packaging facility, etc.) that may, for example, receive a semiconductor wafer as an input to the packaging process.

At any of a variety of stages of the example method 100, at least a portion of the carrier 105 (and in some example implementations, all of the carrier) may be removed. Such removing may be performed in any of a variety of manners (e.g., by mechanically grinding a backside of the carrier 105 or a portion thereof, by chemically etching a backside of the carrier 105 or a portion thereof, by performing chemical/mechanical planarization (CMP), etc.). In other example implementations, the carrier 105 or a portion thereof may be removed by peeling, pulling, shearing, etc. Accordingly, the scope of the present disclosure should not be limited by any particular manner of removing all or a portion of the carrier 105. Note that although the carrier 105 is generally illustrated as a thin layer in the drawings, the carrier 105 may be relatively thick (e.g., providing structural support during various stages of the packaging process) until it is thinned and/or removed.

In general, block S1 may comprise forming (or providing or receiving) a carrier 105 and/or forming a first substrate 110 thereon. Accordingly, the scope of the present disclosure should not be limited by characteristics of any particular carrier or substrate or by characteristics of any particular manner of forming such a carrier or substrate.

Figure 2B:
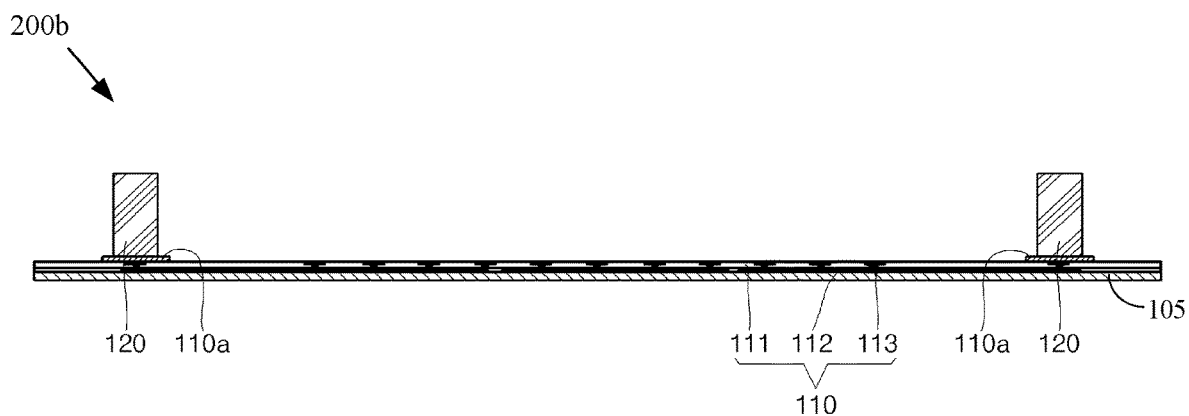

Referring to FIG. 1 and the example structure 200b of FIG. 2B, the example method 100 may, at block S2, comprise forming a first metal (or conductive) pillar, or a plurality thereof. The first metal pillar 120 may, for example, be formed on the first substrate 110 (e.g., on a pad layer 113 thereof, on a signal distribution layer 112 thereof, etc.).

In an example implementation, block S2 may comprise forming the first metal pillar 120 to extend vertically from the pad layer 113 (or the redistribution layer 112) of the first substrate 110. Such forming may be performed in any of a variety of manners, non-limiting examples of which are provided herein.

In an example implementation, Block S2 may, for example, comprise forming a first metal pillar 120 on a respective interconnection pad of the pad layer 113 (e.g., as formed or received at block S1) or on another conductive layer portion. As discussed herein, the respective interconnection pad may, for example, comprise any of a variety of conductive materials (e.g., copper, aluminum, silver, gold, nickel, alloys thereof, etc.). The respective interconnection pad may, for example, be exposed through an aperture in the dielectric layer 111 or another dielectric layer. The dielectric layer 111 may, for example, cover side surfaces of the respective interconnection pad and/or an outer perimeter of the top surface of the respective interconnection pad.

In an example implementation, an under-bump metallization (UBM) structure 110a may be formed, on which the first metal pillar 120 may then be formed. The UBM structure 110a may also be referred to herein as a pillar seed layer 110a.

In an example implementation, Block S2 (or block S1) may comprise forming a UBM seed layer of the UBM structure 110a over the dielectric layer 111 and/or over the portion of the respective interconnection pad of the pad layer 112 that is exposed through an aperture in the dielectric layer 111. The UBM seed layer may, for example, comprise any of a variety of conductive materials (e.g., copper, gold, silver, metal, etc.). The UBM seed layer may be formed in any of a variety of manners (e.g., sputtering, electroless plating, chemical vapor deposition (CVD), physical vapor deposition (PVD), atomic layer deposition (ALD), plasma vapor deposition, etc.).

Block S2 may, for example, comprise forming a mask (or template) over the UBM seed layer to define a region (or volume) in which one or more UBM layers of the UBM structure 110a and/or the first metal pillar 120 (or other interconnection structure) is to be formed. For example, the mask may comprise a photoresist (PR) material or other material, which may be patterned to cover regions other than the region on which the UBM layer(s) and/or first metal pillar 120 are to be formed. Block S2 may then, for example, comprise forming one or more UBM layers on the UBM seed layer exposed through the mask. The UBM layer may comprise any of a variety of materials (e.g., titanium, chromium, aluminum, titanium/tungsten, titanium/nickel, copper, alloys thereof, etc.). Block S2 may comprise forming the UBM layer on the UBM seed layer in any of a variety of manners (e.g., electroplating, sputtering, electroless plating, chemical vapor deposition (CVD), physical vapor deposition (PVD), atomic layer deposition (ALD), plasma vapor deposition, etc.).

Block S2 may then, for example, comprise forming the first metal pillar 120 (or post or other interconnection structure) on the UBM structure 110a (or pillar seed layer). The first metal pillar 120 may comprise any of a variety of characteristics. For example, the first metal pillar 120 may be cylinder-shaped, elliptical cylinder-shaped, rectangular post-shaped, etc. The first metal pillar 120 may, for example, comprise a flat upper end, a concave upper end, or a convex upper end. The first metal pillar 120 may, for example, comprise any of the materials discussed herein with regard to the conductive layers. In an example implementation, the first metal pillar 120 may comprise copper (e.g., pure copper, copper with some impurities, etc.), a copper alloy, etc.). In an example implementation, block S2 (or another block of the example method 100) may also comprise forming a solder cap (or dome) on the first metal pillar 120. Block S2 may comprise forming the first metal pillar 120 in any of a variety of manners (e.g., electroplating, electroless plating, chemical vapor deposition (CVD), metal organic chemical vapor deposition (MOCVD), sputtering or physical vapor deposition (PVD), atomic layer deposition (ALD), plasma vapor deposition, printing, screen printing, lithography, etc.), but the scope of the present disclosure is not limited thereto.

After forming the first metal pillar 120, block S2 may comprise stripping or removing the mask (e.g., chemical stripping, ashing, etc.), if a mask is utilized. Additionally, block S2 may comprise removing at least a portion of the UBM seed layer (e.g., at least the portion that is not covered by the first metal pillar 120 (e.g., by chemically etching, etc.)). Note that during the etching of the UBM seed layer, a lateral edge portion of at least the UBM seed layer under the UBM layer may, for example, be etched. Such etching may, for example, result in an undercut beneath the first metal pillar 120 and the UBM layer of the UBM structure 110*a*.

Figure 2C:
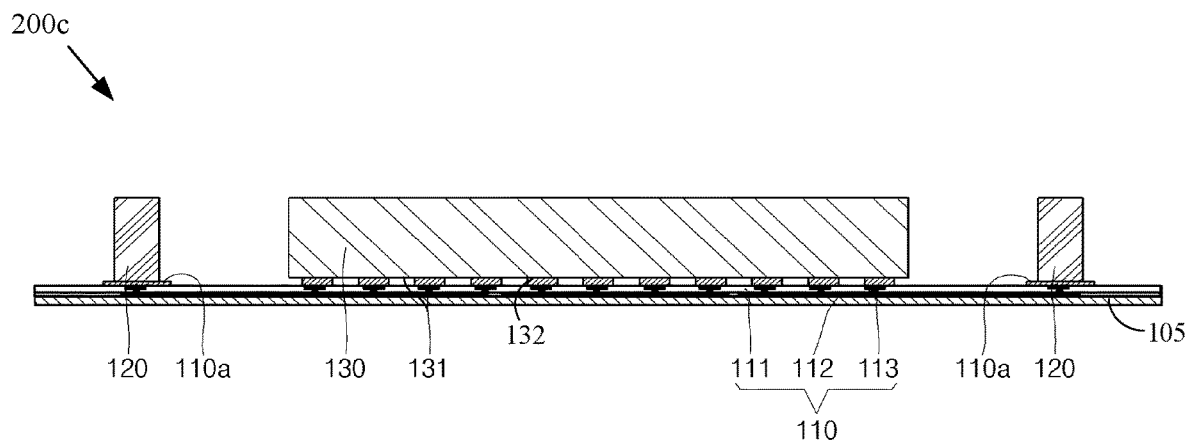

Referring to FIG. 1 and the example structure 200*c* of FIG. 2C, the example method 100 may, at block S3, comprise attaching a first semiconductor die 130 to a top side (or portion) of the first substrate 110. The first semiconductor die 130 may, for example, be oriented in a manner in which an active side 131 (e.g., on which semiconductor is generally formed) of the first semiconductor die 130 faces the first substrate 110 and an inactive side opposite the active side 131 faces away from the first substrate 110. Note that the active side 131 may also be referred to as a conductive side (e.g., comprising die bond pads electrically connected to semiconductor circuitry of the die) and the inactive side may also be referred to as a non-conductive side (or non-patterned side). For example, as illustrated in FIG. 2C, the lower side of the first semiconductor die 130 may be attached to interconnection pads of the pad layer 112 with conductive bumps 132 (e.g., C4 bumps, microbumps, metal pillars, conductive balls, etc.). Block S3 may comprise attaching the first semiconductor die 130 to the top side of the first substrate 110 in any of a variety of manners (e.g., mass reflow, thermocompression bonding, direct metal-to-metal intermetallic bonding, laser soldering, conductive epoxy bonding, etc.).

The first semiconductor die 130 may, for example, be centered on the substrate 110, but may also be laterally offset. For example, a plurality of the first semiconductor die 130 may be attached to the substrate 110 to be included in a same packaged semiconductor device.

Note that the first semiconductor die 130, for example when attached to the substrate 110, may be taller than the first metal pillar 120, shorter than the first metal pillar 120, or generally the same height as the first metal pillar 120. As discussed herein, the tops of the semiconductor die 130 and/or of the first metal pillar(s) 120 may be planarized at any of a variety of stages of the method 100.

The first semiconductor die 130 (as with the second semiconductor die 160 discussed herein) may comprise any of a variety of circuit characteristics. For example, the first semiconductor die 130 may comprise electrical circuits, such as central processing units (CPUs), digital signal processors (DSPs), network processors, power management units, audio processors, RF circuits, wireless baseband system on chip (SoC) processors, sensors, application specific integrated circuits (ASICs), volatile and/or non-volatile memory, etc.

Figure 2D:
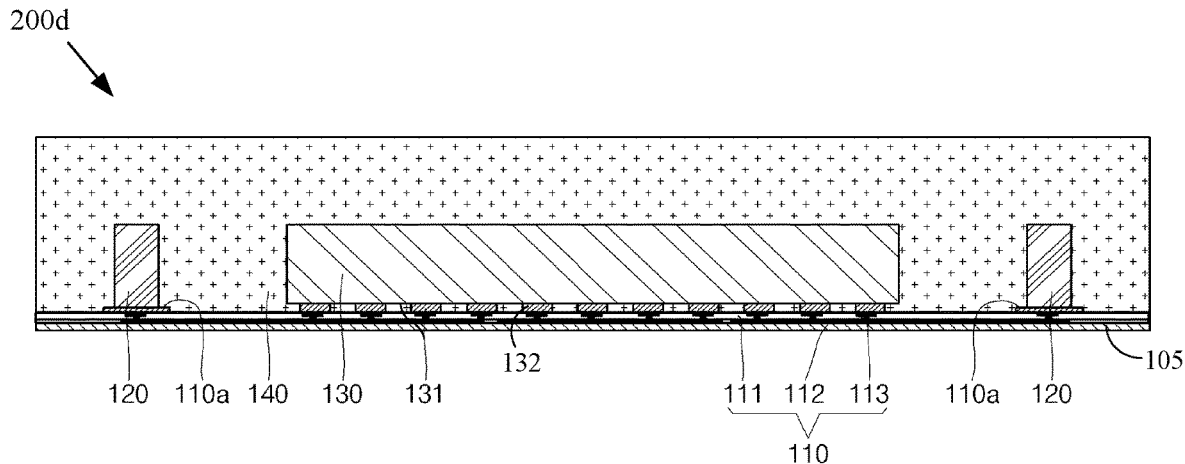

Referring to FIG. 1 and the example structure 200*d* of FIG. 2D, the example method 100 may, at block S4, comprise forming a first encapsulating material 140. Block S4 may comprise forming the first encapsulating material 140 (or encapsulant) in any of a variety of manners, non-limiting examples of which are provided herein.

The first encapsulating material 140 may comprise any of a variety of encapsulating or molding materials (e.g., resin, polymer, polymer composite material, polymer with filler, epoxy resin, epoxy resin with filler, epoxy acrylate with filler, silicone resin, combinations thereof, equivalents thereof, etc.). The first encapsulating material 140 may also, for example, comprise any of the dielectric materials discussed herein (e.g., with regard to the dielectric layer 111, etc.).

Block S4 may comprise forming the first encapsulating material 140 in any of a variety of manners (e.g., compression molding, transfer molding, liquid encapsulant molding, vacuum lamination, paste printing, film assisted molding, etc.). Also for example, block S4 may comprise forming the first encapsulating material 140 utilizing any of a variety of techniques that may be utilized to form a dielectric layer, examples of which are provided herein (e.g., with regard to forming the dielectric layer 111, etc.).

As shown in FIG. 2D, the first encapsulating material 140 may cover a top side of the substrate 110 (e.g. any dielectric and/or conductive layer that is exposed at the top side of the substrate 110). The first encapsulating material 140 may also cover, in-whole or in-part, the lateral sides of the first semiconductor die 130 (or plurality thereof) and/or the lateral sides of the first metal pillar 120 (or plurality thereof). The first encapsulating material 140 may be formed to also cover the top sides of the first semiconductor die 130 and/or of the first metal pillar 120. Though FIG. 2D and other drawings herein show the first encapsulating material 140 only covering the top side of the first substrate 130, it should be understood that the first encapsulating material 140 may also be formed to cover lateral sides of the first substrate 110 (e.g., following separation of the first substrate 130 from a wafer or panel or other set of substrates).

Note that the first encapsulating material 140 may also underfill the first semiconductor die 130, and/or an underfill separate from the first encapsulating material 140 may be applied during and/or after the attaching of the first semiconductor die 130. For example, such underfill may comprise any of a variety of types of material, for example, an epoxy, a thermoplastic material, a thermally curable material, polyimide, polyurethane, a polymeric material, filled epoxy, a filled thermoplastic material, a filled thermally curable material, filled polyimide, filled polyurethane, a filled polymeric material, a fluxing underfill, and equivalents thereof, but not limited thereto. Such underfilling may be performed utilizing a capillary underfill process, utilizing a pre-applied underfill, etc.

Figure 2E:
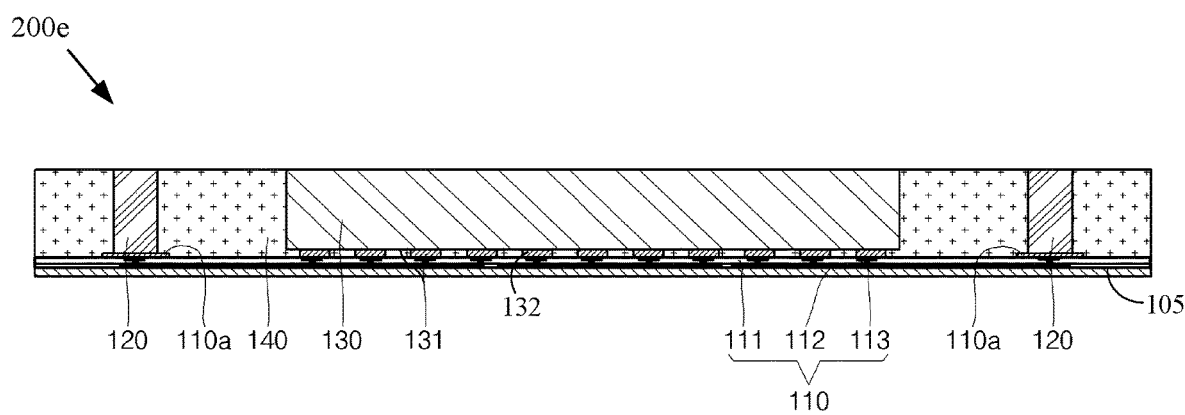

Referring to FIG. 1 and the example structure 200*e* of FIG. 2E, the example method 100 may, at block S5, comprise thinning the assembly as encapsulated at block S4 (e.g., performing a first thinning operation, etc.). For example, block S5 may comprise thinning (e.g., mechanically grinding, chemically etching, shaving or shearing, peeling, any combination thereof, etc.) a top side of the first encapsulating material 140 to a desired thickness. Block S5 may, for example, comprise thinning (e.g., mechanically grinding, chemically etching, shaving, peeling, any combination thereof, etc.) the first semiconductor die 130 (or plurality thereof) and/or the first metal pillar 120 (or plurality thereof). In the example implementation shown in FIG. 2E, block S5 comprises performing the thinning in a manner that results in coplanar top surfaces of the first encapsulating material 140, the first semiconductor die(s) 130, and/or the first metal pillar(s) 120. Thus, at least respective top surfaces (and/or at least an upper portion of lateral side surfaces) of the first semiconductor die(s) 130 and the first metal pillar(s) 120, are exposed from (or at) the top surface of the first encapsulating material 140. Note that while the example implementation shows the top side of the first semiconductor die 130 exposed from the first encapsulating material 140, such exposure is not required. For example, in various implementations, a thin layer of the first encapsulating material 140 covering the top side of the first semiconductor die 130 may remain.

In various example implementations, blocks S1-S5 (and/or the resulting structure) may share any or all characteristics with generally analogous blocks (and/or the resulting structures) shown in U.S. patent application Ser. No. 14/823,689, filed on Aug. 11, 2016, and titled "Semiconductor Package and Fabricating Method Thereof," the entirety of which is hereby incorporated herein by reference in its entirety for all purposes.

Figure 2F:
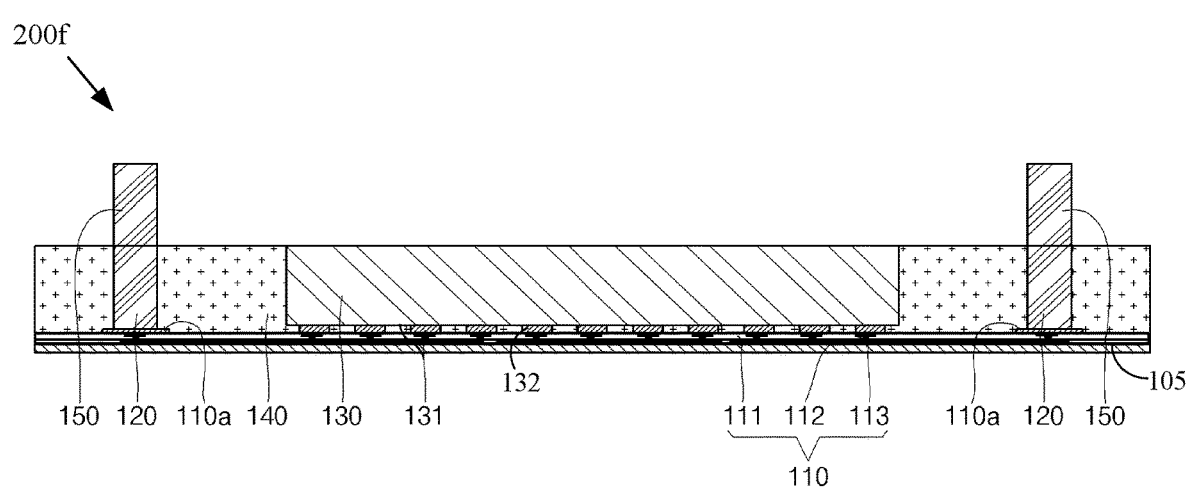

Referring to FIG. 1 and the example structure 200f of FIG. 2F, the example method 100 may, at block S6, comprise forming a second metal pillar (or a plurality thereof). The second metal pillar 150 may, for example be formed on the first metal pillar 120 (e.g., directly on, indirectly on with one or more intervening layers, etc.). Also for example, each of a plurality of second metal pillars 150 may be formed on a respective one of a plurality of the first metal pillars 120.

In an example implementation, block S6 may comprise forming the second metal pillar 150 to extend vertically from the first metal pillar 120. Such forming may be performed in any of a variety of manners, non-limiting examples of which are provided herein. For example, block S6 may comprise forming the second metal pillar 150 in the same manner in which the first metal pillar 120 was formed at block S2. Also for example, Block S6 may comprise forming the second metal pillar 150 in a different manner than that in which the first metal pillar 120 was formed.

In an example implementation, Block S6 may, for example, comprise forming a second metal pillar 150 on (e.g., directly on or indirectly on) a respective first metal pillar 120. As discussed herein, the first metal pillar 120 may, for example, comprise any of a variety of conductive materials (e.g., copper, aluminum, silver, gold, nickel, alloys thereof, etc.). The first metal pillar 120 (e.g., a top surface thereof, a top portion of a lateral surface thereof, etc.) may, for example, be exposed at a top surface of the first encapsulating material 140. The first encapsulating material 140 may, for example, cover a lower portion or all of a lateral side surface of the first metal pillar 120 and/or may cover an outer perimeter of the top surface of the first metal pillar 120.

In an example implementation, block S6 may comprise forming the second metal pillar 150 directly on the top surface of the first metal pillar 120. Note that the lateral and/or vertical dimensions (and/or shape) of the second metal pillar 150 may match the lateral and/or vertical dimensions (and/or shape) of the respective first metal pillar 120, but this need not be the case. For example, the second metal pillar 150 may comprise smaller or larger lateral and/or vertical dimensions that the first metal pillar 120.

In another example implementation, an under-bump metallization (UBM) structure (or interface layer structure) may be formed on the first metal pillar 120, and the second metal pillar 150 may then be formed on the UBM structure. If formed, block S6 may comprise forming such a UBM structure (or interface layer structure) in a same manner as that discussed herein with regard to the UBM structure 110a (or pillar seed layer) that may be formed at block S2, for example utilizing the same or similar masking process, metal forming process, masking and/or metal removing process, etc.

The second metal pillar 150 may comprise any of a variety of characteristics. For example, the second metal pillar 150 may be cylinder-shaped, elliptical cylinder-shaped, rectangular post-shaped, etc. The second metal pillar 150 may, for example, comprise a flat upper (and/or lower) end, a concave upper (and/or lower) end, or a convex upper (and/or lower) end. The second metal pillar 150 may, for example, comprise any of the materials discussed herein with regard to the conductive layers, with regard to the first metal pillar 120, etc. In an example implementation, the second metal pillar 150 may comprise copper (e.g., pure copper, copper with some impurities, etc.), a copper alloy, etc.). In an example implementation, block S6 (or another block of the example method 100) may also comprise forming a solder cap (or dome) or layer of another metal on the second metal pillar 150. Block S6 may comprise forming the second metal pillar 150 in any of a variety of manners (e.g., electroplating, electroless plating, chemical vapor deposition (CVD), metal organic chemical vapor deposition (MOCVD), sputtering or physical vapor deposition (PVD), atomic layer deposition (ALD), plasma vapor deposition, printing, screen printing, lithography, etc.), but the scope of the present disclosure is not limited thereto.

As discussed herein, the second metal pillar 150 (or a plurality thereof) may be exactly aligned with a respective first metal pillar, but such alignment may also be misaligned (e.g., by design or due to manufacturing tolerances). Thus, there may be a surface discontinuity between the second metal pillar 150 and the first metal pillar 120 (e.g., a step, a sharp curve, etc.). Note that, as discussed herein, the second metal pillar 150 may be laterally displaced from the first metal pillar 120 so that there is no direct vertical overlap between the second metal pillar 150 and the first metal pillar 120 (e.g., forming a signal distribution structure to electrically connect the second metal pillar 150 and the first metal pillar 120).

As discussed herein, the second metal pillar 150 may be formed having any of a variety of height (or vertical) dimensions. For example, block S6 may comprise forming the second pillar 150 to have a height that is taller than a desired final height (e.g., to compensate for manufacturing tolerances, etc.). Also for example, block S6 may comprise forming the second metal pillar 150 to have a height that is as high or higher than an expected height of a second semiconductor die (e.g., as mounted at block S7, etc.).

Figure 2G:
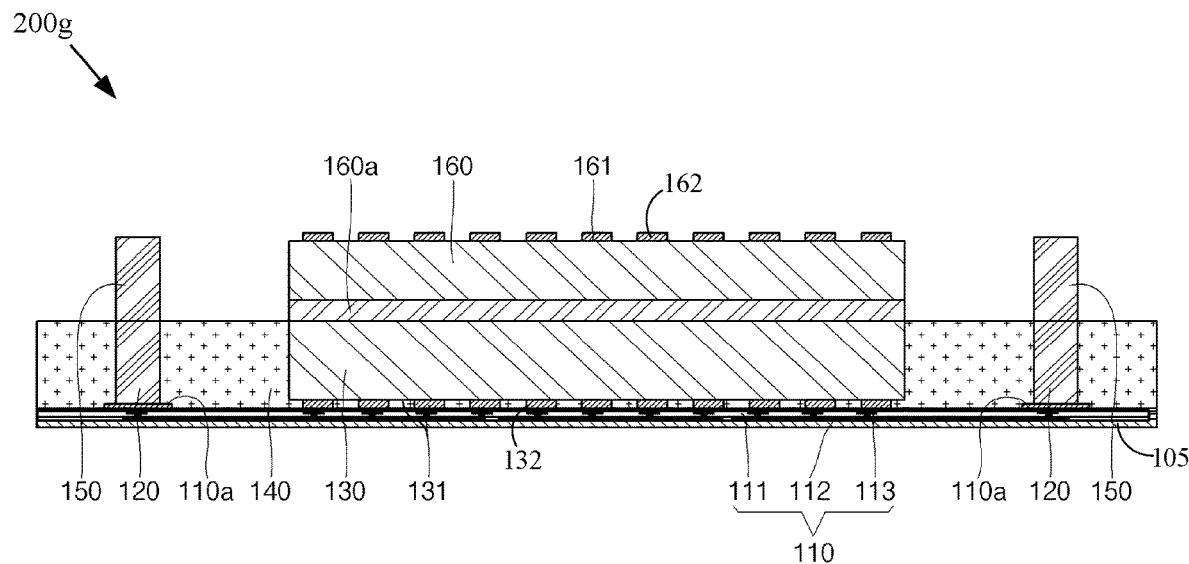

Referring to FIG. 1 and the example structure 200g of FIG. 2G, the example method 100 may, at block S7, comprise attaching a second semiconductor die 160 (or a plurality thereof) to a top side (or portion) of the first semiconductor die 130. Block S7 may, for example, share any or all characteristics with block S3.

In an example implementation, the second semiconductor die 160 may, for example, be oriented in a manner in which an active side 161 of the semiconductor die 130 faces away from the first semiconductor die 130, and inactive side of the semiconductor die 130 faces toward the first semiconductor die 130. For example, the respective inactive sides of the first and second semiconductor dies 130 and 160 may face each other. The second semiconductor die 160 may, for example, be centered over the first semiconductor die 130. The second semiconductor die 160 may, for example, have a size that is equal to, less than, or greater than the size of the first semiconductor die 130. Note that, as discussed herein, the second semiconductor die 160 may be laterally displaced relative to the first semiconductor die 130. Also note that there may be one or more of the first semiconductor dies 130 (of a same or different type) and one or more of the second semiconductor dies 160 (of a same or different type).

The second semiconductor die 160 (as with the first semiconductor die 130 discussed herein) may comprise any of a variety of circuit characteristics. For example, the second semiconductor die 160 may comprise electrical circuits, such as central processing units (CPUs), digital signal processors (DSPs), network processors, power management units, audio processors, RF circuits, wireless baseband system on chip (SoC) processors, sensors, application specific integrated circuits (ASICs), volatile and/or non-volatile memory, etc. In an example implementation, the second semiconductor die 160 may perform a same function as the first semiconductor die 130 (e.g., both performing memory functionality, both performing processing functionality, etc.). In another example implementation, the second semiconductor die 160 may perform a different function than the first semiconductor die 130. Such different respective functions may, however, be complementary (e.g., one performing a processing function, one performing a memory function, another die performing a communication function, another die performing a sensor function, etc.).

For example, as illustrated in FIG. 2G, the lower side of the second semiconductor die 160 may be attached to the upper side of the first semiconductor die 130 with an adhesion member 160a. The adhesion member 160 may, for example comprise a layer of adhesive paste, a layer of liquid adhesive, a preformed double-sided adhesive tape or sheet (e.g., a die-attach tape), etc. The adhesion member 160a may, for example, partially or completely cover the bottom side of the second semiconductor die 160. The adhesion member 160a may also, for example, partially or completely cover the top side of the first semiconductor die 130. For example, though not shown in FIG. 2G, the adhesion member 160a may cover at least a portion of a top side of the first encapsulating material 140, for example a portion of the top side of the first encapsulating material 140 that is around the periphery of the first semiconductor die 140 and immediately adjacent to the first semiconductor die 140. The adhesion member 160a may, for example, comprise a dielectric material that inhibits electrical connectivity between the first semiconductor die 130 and the second semiconductor die 160. The adhesion member 160a may, however, be thermally conductive. Note that the adhesion member 160a may, in various example implementations, be electrically conductive.

Note that the second semiconductor die 160, for example when attached to the first semiconductor die 130, may be taller than the second metal pillar 150, shorter than the second metal pillar 150, or generally the same height as the second metal pillar 150. In an example implementation, the second semiconductor die 160 may comprise conductive bumps 162 (or pads, pillars, balls, other interconnection structures, etc.) on the active side 161 that extend in an upward direction. In such an implementation, the height of the second metal pillar 150 may be at least as high as a lower end of such conductive bumps 162. In such a configuration, the second metal pillar 150 and the conductive bumps 162 of the second semiconductor die 160 may be planarized (e.g., at block S9, etc.) without damaging active circuitry on the active side 161 of the second semiconductor die 160. The tops of the conductive bumps 162, the second semiconductor die 160 and/or the second metal pillar(s) 150 may be planarized at any of a variety of stages of the method 100.

Note that although not explicitly shown in FIG. 1, a testing operation may be performed on the assembly before the second semiconductor die is attached at block S7.

Figure 2H:
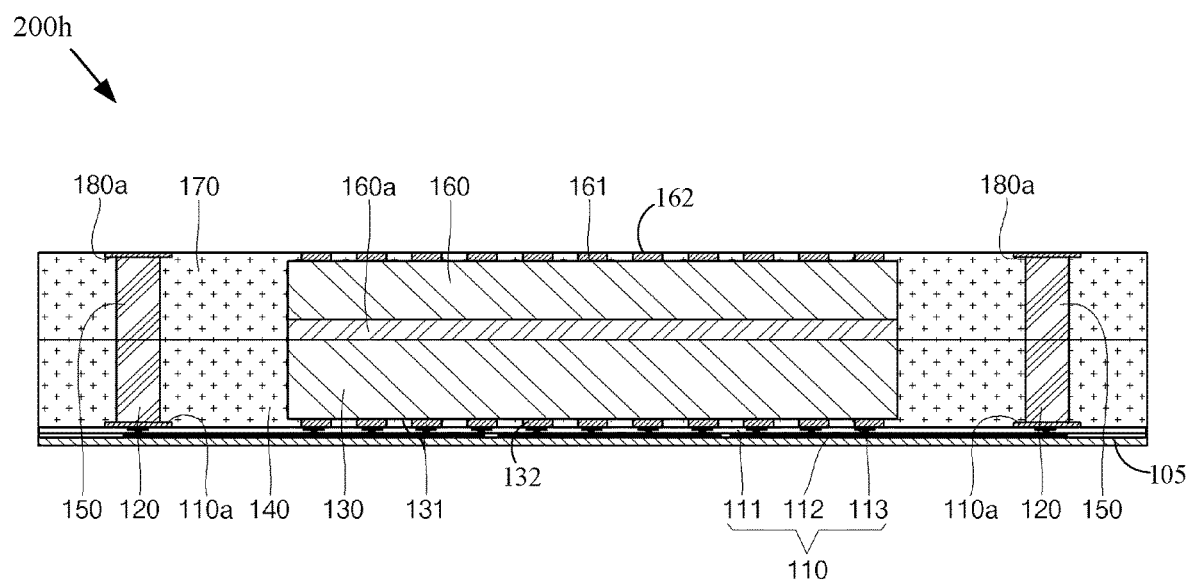

Referring to FIG. 1 and the example structure 200h of FIG. 2H, the example method 100 may, at block S8, comprise forming a second encapsulating material 170. Block S8 may comprise forming the second encapsulating material 170 (or encapsulant) in any of a variety of manners, non-limiting examples of which are provided herein. Block S8 may, for example, share any or all characteristics with Block S4 discussed herein.

The second encapsulating material 170 may comprise any of a variety of encapsulating or molding materials (e.g., resin, polymer, polymer composite material, polymer with filler, epoxy resin, epoxy resin with filler, epoxy acrylate with filler, silicone resin, combinations thereof, equivalents thereof, etc.). The second encapsulating material 170 may also, for example, comprise any of the dielectric materials discussed herein (e.g., with regard to the dielectric layer 111, etc.). The encapsulating material 170 may, for example, comprise a same material as the first encapsulating material 140. Note however, in an example implementation, the second encapsulating material 170 may be a different material than the first encapsulating material 140, for example a material having different physical properties (e.g., different coefficient of thermal expansion (CTE), elasticity modulus, shrinkage factor, etc.). Such an implementation may, for example, be utilized to reduce or eliminate warping of the semiconductor package by tuning (or balancing) warpage forces (e.g., due to different respective coefficients of thermal expansion of the various components of the semiconductor device, different etc.).

Block S8 may comprise forming the second encapsulating material 170 in any of a variety of manners (e.g., compression molding, transfer molding, liquid encapsulant molding, vacuum lamination, paste printing, film assisted molding, etc.). Also for example, block S8 may comprise forming the second encapsulating material 170 utilizing any of a variety of techniques that may be utilized to form a dielectric layer, examples of which are provided herein (e.g., with regard to forming the dielectric layer 111, etc.).

As shown in FIG. 2H, the second encapsulating material 170 may cover a top side of the first encapsulating material 140. The second encapsulating material 170 may also cover, in-whole or in-part, the lateral sides of the second semiconductor die 160 and/or the lateral sides of the second metal pillar(s) 150. The second encapsulating material 170 may additionally cover lateral and/or upper sides of the adhesion member 160a. The second encapsulating material 170 may be formed to also cover the top sides of the second semiconductor die 160 (e.g., any or all of a dielectric layer on a top side thereof, a conductive layer on a top side thereof, conductive bumps on a top side thereof, etc.) and/or of the second metal pillar(s) 150. As shown in FIG. 2H, the second encapsulating material 170 may cover lateral sides of the conductive bumps 162 on the active side 161 of the second semiconductor die 160, while the upper ends of the conductive bumps 162 may be exposed. As with the first encapsulating material 140 formed at block S4, the second encapsulating material 170 may be formed at a wafer or panel level for a plurality of semiconductor packages simultaneously, or may be formed at an individual package level.

Note that in an example implementation in which there is space between the second semiconductor die 160, and the first semiconductor die 130 or first encapsulating material 140 (e.g., when the adhesion member 160a does not entirely fill such space, etc.), the second encapsulating material 170 may also underfill the second semiconductor die 160 between the second semiconductor die 160, and the first semiconductor die 130 and/or first encapsulating material 140.

Still referring to FIGS. 1 and 2H, the example method 100 may, at block S9, comprise thinning the assembly as encapsulated at block S8 (e.g., performing a second thinning operation, etc.). For example, block S9 may comprise thinning (e.g., mechanical grinding, chemically etching, shaving or shearing, peeling, any combination thereof, etc.) a top side of the second encapsulating material 170, the second metal pillar 150 and/or a top side of the second semiconductor die 160 (e.g., conductive bumps 162 on the active side 161 of the second semiconductor die 160) to a desired thickness. Block S9 may, for example, share any or all characteristics with Block S5.

In the example implementation shown in FIG. 2H, block S9 comprises performing the thinning in a manner that results in coplanar top surfaces of the second encapsulating material 170, the second semiconductor die 160 (e.g., conductive bumps 162 or other interconnection structures on an active side 161 thereof, etc.), and/or the second metal pillar(s) 150. Thus, at least respective top surfaces (and/or at least an upper portion of lateral side surfaces) of conductive bumps 162 on a top side of the second semiconductor die 160 and the second metal pillar(s) 150 are exposed from (or at) the top surface of the second encapsulating material 170.

As discussed herein, the second metal pillar 150 may, in some implementations, be formed with an interface layer on a top end thereof (e.g., a solder layer, a UBM layer, an interface metallization, etc.). In the example implementation shown in FIG. 2H, block S9 may also comprise exposing and/or planarizing such interface layer at the top end of the second metal pillar 150.

As discussed herein, the second encapsulating material 170 may be originally formed having any of a variety of thicknesses. In an example implementation in which the second encapsulating material 170 is formed at its desired thickness and in which the top side conductors are exposed from the second encapsulating material 170 as desired (e.g., utilizing film-assisted molding, spin coating, etc.), the thinning at block S9 might be skipped.

Figure 2I:
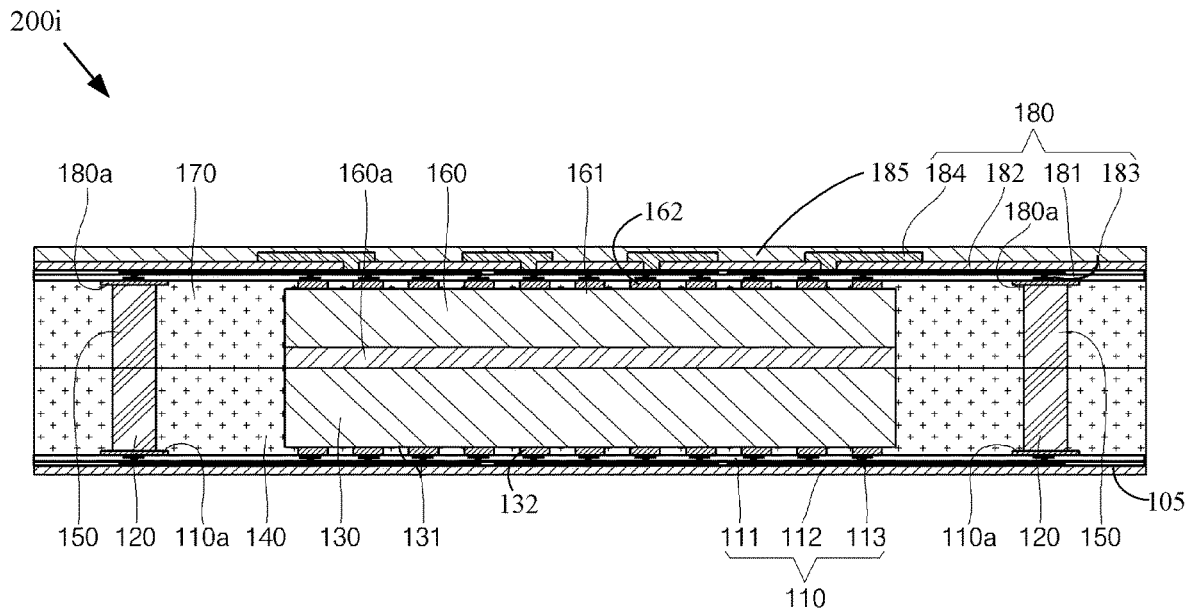

Referring to FIG. 1 and the example structure 200i of FIG. 2I, the example method 100 may, at block S10, comprise forming a second substrate 180. Block S10 may, for example, comprise forming the second substrate 180 on top of the second encapsulating material 170, the second metal pillar 150, and/or the second semiconductor die 160.

Block S10 may comprise forming the second substrate 180, which may also be referred to herein as an interposer, in any of a variety of manners, non-limiting examples of which are provided herein. For example, block S10 may share any or all characteristics with block S1. Block S10 may, for example, share any or all characteristics with generally analogous blocks (and/or the resulting structures) shown in U.S. patent application Ser. No. 14/823,689, filed on Aug. 11, 2016, and titled "Semiconductor Package and Fabricating Method Thereof," the entirety of which is hereby incorporated herein by reference in its entirety for all purposes.

Block S10 may, for example, comprise forming the second substrate 180 having any number of dielectric layers and conductive layers (e.g., signal distribution layers, pad layers, conductive vias, underbump metallization, land layers, etc.). In an example implementation, a second substrate 180 comprising a signal distribution layer 182, a dielectric layer 181, and a pad (or via) layer 183 may be formed. Note that while the second substrate 180 may be generally different from the first substrate 110, any or all characteristics may be the same, may be vertically and/or horizontally symmetrical, etc.

The pad (or via) layer 183, which may also be referred to herein as a pad, a via, a trace, a land, a bond pad layer, a conductive layer, a trace layer, etc., may comprise any of a variety of materials (e.g., copper, aluminum, nickel, iron, silver, gold, titanium, chromium, tungsten, palladium, combinations thereof, alloys thereof, equivalents thereof, etc.), but the scope of the present disclosure is not limited thereto.

Block S10 may comprise forming the pad (or via) layer 183 layer in any of a variety of manners, non-limiting examples of which are presented herein. For example, block S10 may comprise forming the pad (or via) layer 183 utilizing any one or more of a variety of processes (e.g., electrolytic plating, electroless plating, chemical vapor deposition (CVD), metal organic chemical vapor deposition (MOCVD), sputtering or physical vapor deposition (PVD), atomic layer deposition (ALD), plasma vapor deposition, printing, screen printing, lithography, etc.), but the scope of the present disclosure is not limited thereto. Block S10 may, for example, comprise forming the pad layer 183 on a top side of the second metal pillar 150, on top sides of the conductive bumps 162, etc.

As with any of the conductive layers discussed herein, block S10 may comprise forming one or more seed layers as part of the processing of forming the pad (or via) layer 183 (e.g., prior to electroplating the pad layer 183, etc.). For example, though not shown in FIG. 2I, block S10 may comprise forming one or more seed layers on the top surface of the second metal pillar 150, conductive bumps 162, second encapsulating material 170, etc.

Note that in various example implementation, prior to forming the pad (or via) layer 183, one or more dielectric layers may be formed over the top surface of the second encapsulating material 170, second semiconductor die 160, and/or second metal pillar(s) 150.

The dielectric layer 181 may comprise one or more layers of any of a variety of dielectric materials, for example inorganic dielectric materials (e.g., $Si_3N_4$, $SiO_2$, SiON, SiN, oxides, nitrides, combinations thereof, equivalents thereof, etc.) and/or organic dielectric materials (e.g., a polymer, polyimide (PI), benzocyclobutene (BCB), polybenzoxazole (PBO), bismaleimide triazine (BT), a molding material, a phenolic resin, an epoxy, silicone, acrylate polymer, combinations thereof, equivalents thereof, etc.), but the scope of the present disclosure is not limited thereto.

Block S10 may comprise forming the dielectric layer 181 utilizing any one or more of a variety of processes (e.g., spin coating, spray coating, printing, sintering, thermal oxidation, physical vapor deposition (PVD), chemical vapor deposition (CVD), atomic layer deposition (ALD), low pressure chemical vapor deposition (LPCVD), plasma enhanced chemical vapor deposition (PECVD), plasma vapor deposition (PVD), sheet lamination, evaporating, etc.), but the scope of the present disclosure is not limited thereto.

Block S10 may, for example, also comprise patterning the dielectric layer 181, for example forming apertures therein that expose various portions of various conductive layers discussed herein (e.g., pad layers 183, signal distribution layers, etc.). For example, block S10 may comprise ablating apertures (e.g., utilizing laser ablation, utilizing mechanical ablation, utilizing etching, etc.). Also for example, block S10 may comprise originally forming the dielectric layer 181 (e.g., depositing, etc.) having the desired apertures.

The signal distribution layer 182, which may also be referred to herein as a redistribution layer, a distribution layer, a conductive layer, a trace layer, etc., may comprise any of a variety of materials (e.g., copper, aluminum, nickel, iron, silver, gold, titanium, chromium, tungsten, palladium, combinations thereof, alloys thereof, equivalents thereof, etc.), but the scope of the present disclosure is not limited thereto. The signal distribution layer 182 (or second substrate 180) may, for example, provide electrical signal pathways between terminals of the second semiconductor die 160 and/or respective second metal pillars 120 and/or respective lands 184.

Block S10 may comprise forming the signal distribution layer 182 layer in any of a variety of manners, non-limiting examples of which are presented herein. For example, block S10 may comprise forming the signal distribution layer 182 utilizing any one or more of a variety of processes (e.g., electroplating, electroless plating, chemical vapor deposition (CVD), metal organic chemical vapor deposition (MOCVD), sputtering or physical vapor deposition (PVD), atomic layer deposition (ALD), plasma vapor deposition, printing, screen printing, lithography, etc.), but the scope of the present disclosure is not limited thereto.

In various example scenarios, for example in which the signal distribution layer 182 is electroplated, block S10 may comprise forming one or more seed layers prior to electroplating the signal distribution layer 182. For example, though not shown in FIG. 2I, block S10 may comprise forming one or more seed layers on the top surface of the second encapsulating material 170, second semiconductor die 160, and/or second metal pillar 150. Such seed layer(s) may comprise any of a variety of materials. For example, the seed layer(s) may comprise copper. Also for example, the seed layer(s) may comprise one or more layers of any of a variety of metals (e.g., silver, gold, aluminum, tungsten, titanium, nickel, molybdenum, etc.). The seed layers may be formed utilizing any of a variety of techniques (e.g., sputtering or other physical vapor deposition (PVD) technique, chemical vapor deposition (CVD), electroless plating, electrolytic plating, etc.). The seed layer(s) may, for example, be utilized during a subsequent electroplating process.

Block S10 may comprise forming any number of conductive and dielectric layers of the second substrate 180. In the example implementation shown in FIG. 2I, block S10 comprises forming a second dielectric layer 185 and a land layer 184. The second dielectric layer 185 and/or the forming thereof may share any or all characteristics with other dielectric layers and/or the forming thereof discussed herein. The land layer 184 and/or the forming thereof may share any or all characteristics with other conductive layers and/or the forming thereof discussed herein. Note that the land layer 184 may, for example, also be referred to as a conductive layer, a pad, a land, a signal distribution structure, etc.

For example, in an example implementation, the land layer 184 may comprise under bump metallization, as discussed herein. For example, block S10 may comprise forming the land layer 184 to have one or more metallization layers conducive to the attachment of interconnection structures (e.g., conductive balls, conductive pillars or posts, etc.), for example as attached at block S11. The land layer 184 may, for example, be exposed at the top surface of the second substrate 180 (e.g., second dielectric layer 185, etc.).

As with the signal distribution layer 182, or any conductive layer discussed herein, block S10 may comprise forming one or more seed layers as part of the processing of forming the land layer 184 (e.g., prior to electroplating the land layer 184, etc.). For example, though not shown in FIG. 2I, block S10 may comprise forming one or more seed layers on the top surface of the signal distribution layer 182, on a top surface and/or aperture surfaces of the dielectric layer 181, etc.

Note that although an illustrative set of conductive layers and dielectric layers is shown in the drawings, block S10 may comprise forming the second substrate 180 to have any number of such conductive and/or dielectric layers.

As discussed herein, first substrate 110 (or interposer), or a portion thereof, may be formed in a semiconductor wafer fabrication process (e.g., at a wafer fab facility, etc.). Also for example, any or all of the layers of the first substrate 110 may be performed in a packaging process that may, for example, receive a semiconductor wafer as an input to the packaging process. In an example implementation, the layers (e.g., conductive layers, dielectric layers, etc.) of the second substrate 180 may be performed in a packaging process. Thus, in various example implementations, one or more substrate portions may be formed in a semiconductor wafer fabrication process and one or more substrate portions may be formed in a semiconductor device packaging process.

In general, block S10 may comprise forming a second substrate 180 (or interposer). Accordingly, the scope of the present disclosure should not be limited by characteristics of any particular carrier or substrate or by characteristics of any particular manner of forming such a carrier or substrate.

Referring to FIG. 1 and the example structure 200i of FIG. 2I, the example method 100 may, at block S11, comprise forming conductive interconnection structures 190 on the second substrate 180.

The conductive interconnection structures 190 may comprise any of a variety of characteristics. For example, an interconnection structure 190 may comprise a conductive ball or bump (e.g., a solder ball or bump, wafer bump, a solid core or copper core solder ball, etc.). For example, in an example implementation including a solder ball or bump, such balls or bumps may comprise tin, silver, lead, Sn—Pb, $Sn_{37}$—Pb, $Sn_{95}$—Pb, Sn—Pb—Ag, Sn—Pb—Bi, Sn—Cu, Sn—Ag, Sn—Au, Sn—Bi, Sn—Ag—Cu, Sn—Ag—Bi, Sn—Zn, Sn—Zn—Bi, combinations thereof, equivalents thereof, etc., but the scope of this disclosures is not limited thereto. A conductive interconnection structure 190 may also comprise a conductive pillar or post, a wire, a land, etc., which may for example comprise any of the conductive materials (e.g., metals, conductive adhesives, etc.) discussed herein.

The conductive interconnection structures 190 may be configured in any or a variety of configurations. For example, the conductive interconnection structures 190 may be configured in a ball grid array configuration, a land grid array configuration, etc.

Block S11 may comprise forming (or attaching) such interconnection structures 190 in any of a variety of manners, non-limiting examples of which are provided herein. For example, block S11 may comprise forming (or attaching) such interconnection structures 190 by ball-dropping, bumping, metal-plating, pasting and reflowing, etc. For example, block S11 may comprise dropping a conductive ball on the land layer 184 (or pad), reflowing, and cooling.

Step S11 may also, for example, comprise forming (or attaching) components 191 (e.g., passive components, active components, etc.) on the land layer 184 of the second substrate 180. In an example implementation, the components 191 may have a smaller height than the conductive interconnection structures 190. For example, the components 191 may have a smaller height than a solder ball conductive interconnection structure 190, a smaller height than a solid core (e.g., a copper core, etc.) of a solder ball conductive interconnection structure 190, etc. In such an implementation, the conductive interconnection structures 190 may provide a standoff to maintain space for the components 191 when the conductive interconnection structures 190 are attached to another substrate or component.

Referring to FIG. 1 and the example structure 200i of FIG. 2I, the example method 100 may, at block S12, comprise singulating a semiconductor device package from a plurality of connected packages.

As mentioned here, any or all of the blocks of the example method 100 may be performed at a wafer or panel level, for example forming a plurality of semiconductor packages at the same time. The wafer or panel may then, for example, be singulated into individual packages. Such singulating may, for example, be performed by any one or more of mechanical cutting (e.g., sawing, cutting, abrading, snapping, etc.), energy cutting (e.g., laser cutting, plasma cutting, etc.), chemical cutting (e.g., etching, dissolving, etc.), etc. In an example implementation, such singulating may form coplanar lateral side surfaces of the package. For example, one or more of the lateral side surfaces of the first substrate 110, first encapsulating material 140, second encapsulating material 170, and/or second substrate 180 may be coplanar on one or more lateral sides of the singulated semiconductor package.

Figure 2J:
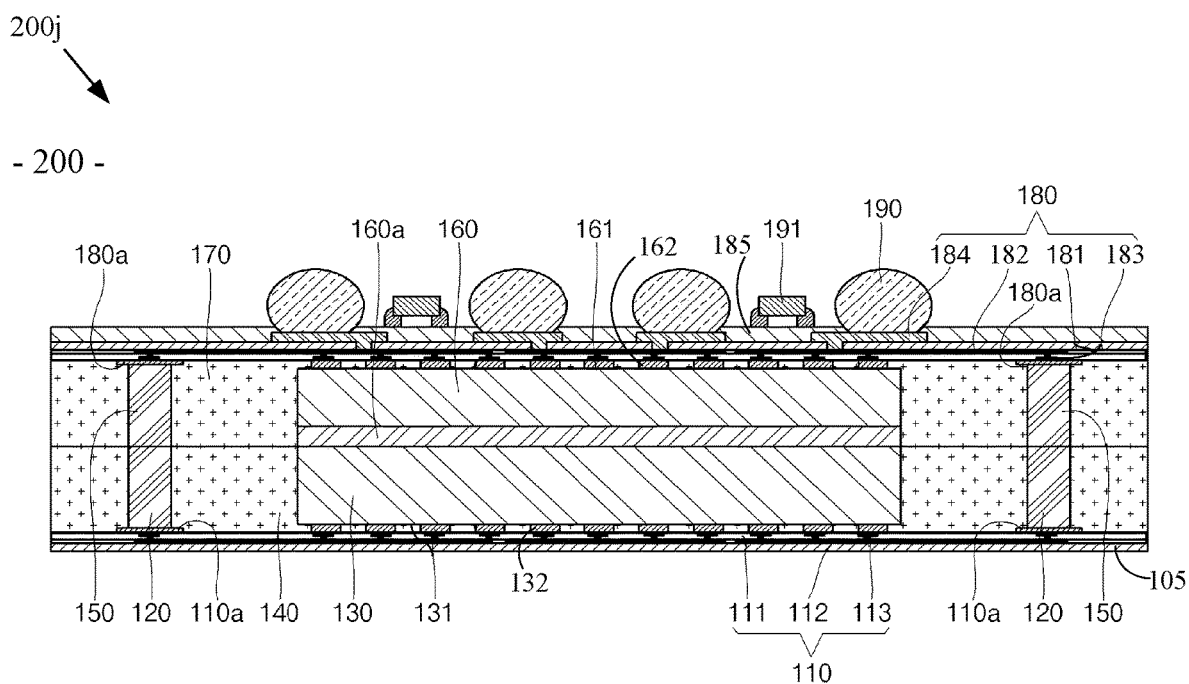

The example semiconductor device package 200 shown in FIG. 2J may result from the example method 100 of FIG. 1, as discussed herein. Note that other method steps may be performed on the example package 200, for example adding or removing components, etc., without departed from the scope of this disclosure. Note that the example semiconductor device 200 (or any device discussed herein) may be referred to as a semiconductor package, an electronic device, an electronic package, a device, a package, etc.

Figure 3:
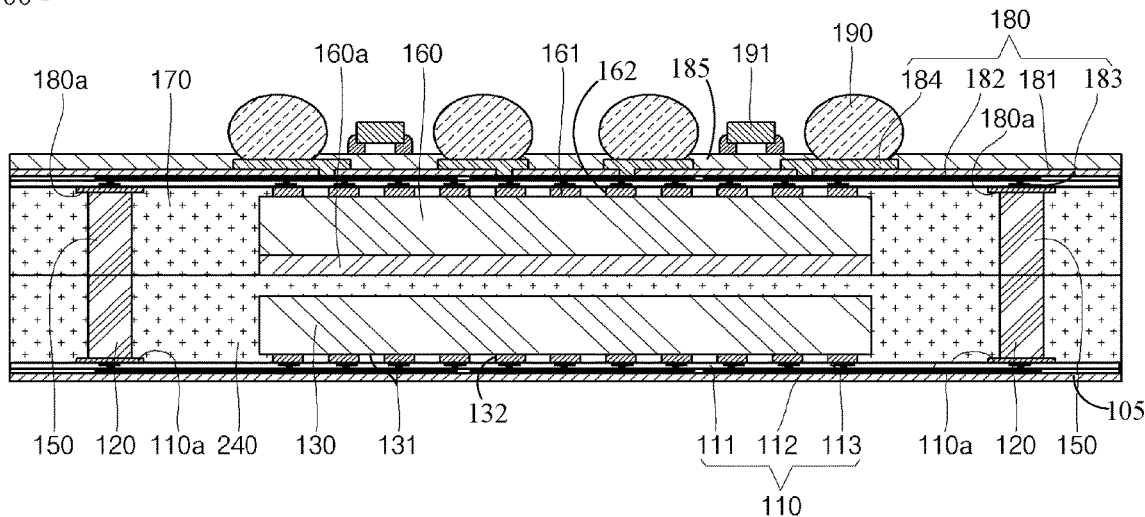
FIG. 3 shows a cross-sectional view of an example semiconductor device, in accordance with various aspects of the present disclosure.

As discussed herein, in an example implementation, block S5 may be skipped or may be performed to a degree that leaves the first encapsulating material 140 having a higher height than the first semiconductor die 130. For example, the top surface of the first encapsulating material 140 and the top surface(s) of the first metal pillar(s) 120 may be coplanar, while the top surface of the first semiconductor die 130 remains covered by the first encapsulating material 140. In such an example implementation, block S7 may comprise attaching the second semiconductor die 160 to the top surface of the first encapsulating material 140 (e.g., directly above and centered on the first semiconductor die 130, partially directly above and partially not directly above the first semiconductor die 130, completely laterally offset from the first semiconductor die 130, etc.) utilizing the adhesion member 160a. FIG. 3 shows an example semiconductor device 300 that may result from such a process.

More specifically, FIG. 3 shows a cross-sectional view of an example semiconductor device 300, in accordance with various aspects of the present disclosure. It should be understood that the example device 300 may share any or all characteristics with the other examples devices discussed herein, for example, with the other example devices shown in FIGS. 2A-2J, 4, and 5.

As shown in FIG. 3, in the example semiconductor device 300, a top portion of the first encapsulating material 240 covers the top side of the first semiconductor die 130. The first metal pillars 120 are taller than the first semiconductor die 130. The top ends of the first metal pillars 120 and the top side of the first encapsulating material 140 may, for example, be coplanar. The adhesion unit 160a contacts the top side of the first encapsulating material 140 and contacts the lower side of the second semiconductor die 160.

During processing, the first encapsulating material 240 may, for example, prevent foreign materials from being formed on the first semiconductor die 130. For example, if grinding is performed to expose the first metal pillar 120 after forming the first metal pillar 120, there is a possibility that particles of a metal from grinding the first metal pillar 120 (e.g., copper particles, etc.) may be scattered toward the first semiconductor die 130. However, since the first encapsulating material 240 encapsulates the top side (or portion) of the first semiconductor die 130, the first encapsulating material 240 prevents the metal particles from directly contacting and/or from being mounted on the first semiconductor die 130. Thus, the encapsulating material 240 may prevent damage from being caused to the first semiconductor die 130.

Figure 4:
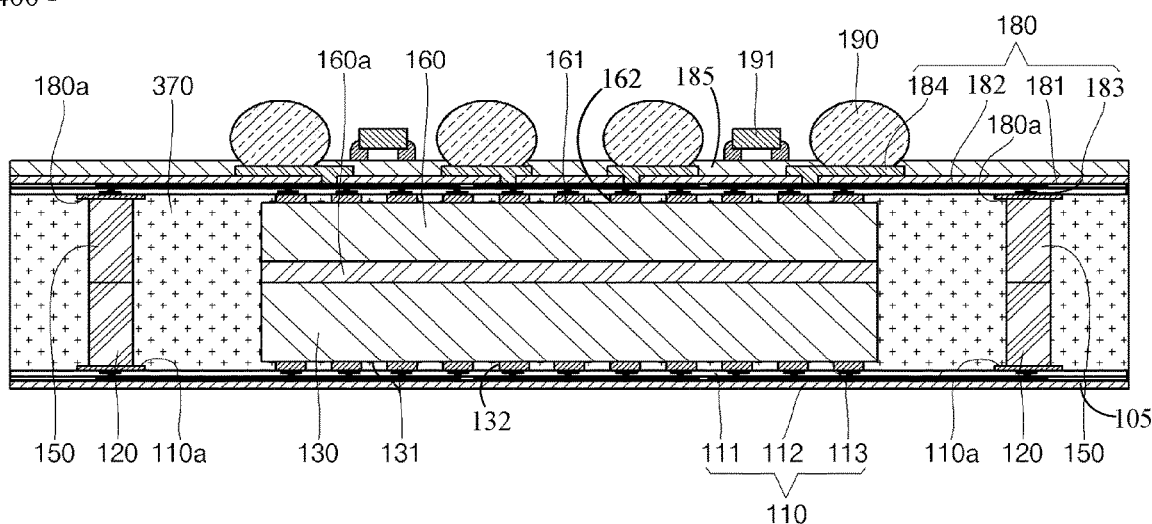
FIG. 4 shows a cross-sectional view of an example semiconductor device, in accordance with various aspects of the present disclosure.

In another example implementation, blocks S4 and/or S5 of the example method 100 may be skipped. For example, block S8 may comprise performing a first encapsulating step instead of a second encapsulating step. For example, block S8 may combine the first encapsulating at block S4 and the second encapsulating at block S8 in the example method 100 of FIG. 1. In such an example implementation, block S8 may comprise forming a single integral encapsulating material that covers the various elements of the semiconductor device as discussed herein with regard to both the first encapsulating material 140 and the second encapsulating material 170. For example, the single integral encapsulating material may encapsulate the first metal pillar(s) 120, the first semiconductor die 130, the second metal pillar 150, and the second semiconductor die 160. FIG. 4 shows an example semiconductor device 400 that may result from such a process.

More specifically, FIG. 4 shows a cross-sectional view of an example semiconductor device 400, in accordance with various aspects of the present disclosure. It should be understood that the example device 400 may share any or all characteristics with the other examples devices discussed herein, for example, with the other example devices shown in FIGS. 2A-2J, 3, and 5.

As shown in FIG. 4, the single unitary and continuous encapsulating material 370 replaces the first encapsulating material 140 and the second encapsulating material 170 of various other implementations. For example, the encapsulating material 370 may share any or all characteristics with the first encapsulating material 140 and second encapsulating material discussed herein, albeit as a single unitary continuous encapsulating material.

In an example implementation, for example at block S8 of the example method 100 (e.g., skipping block S4, etc.), the encapsulant 370 may be formed after the first metal pillar 120, the first semiconductor die 130, the second metal pillar 150 and the second semiconductor die 160 on the top side of the first substrate 110 are all formed. Block S8 may, for example comprise forming the encapsulant 370 by simultaneously forming the first encapsulant 140 and the second encapsulant 170 of the semiconductor device 100.

In such an implementation, the encapsulant 370 may be formed in a simplified manner, thus reducing the number of process steps and time for manufacturing the semiconductor device 400.

Figure 5:
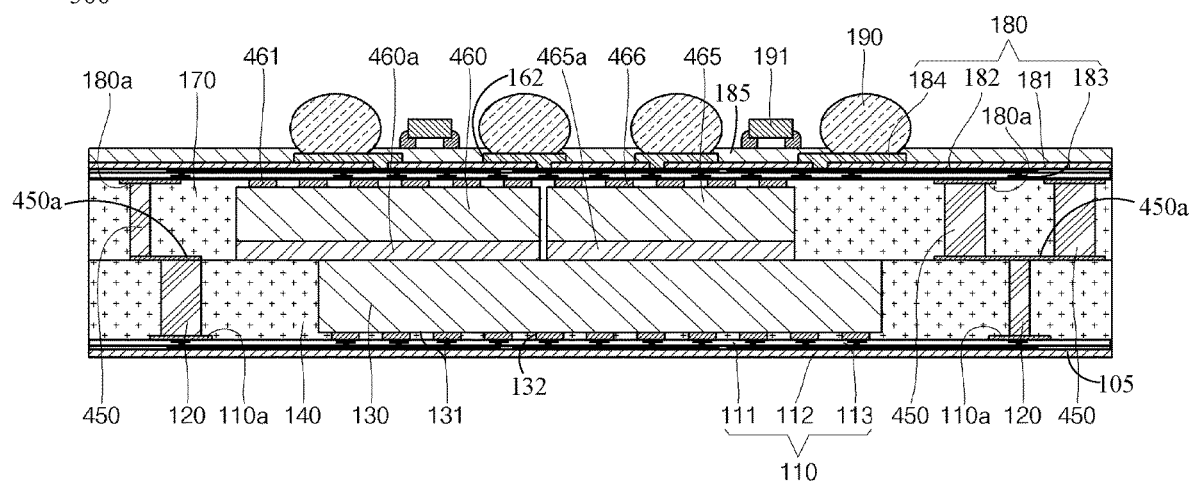
FIG. 5 shows a cross-sectional view of an example semiconductor device, in accordance with various aspects of the present disclosure.

In yet another example implementation, as discussed herein, the first metal pillars 120 and the second metal pillars 150 may be laterally offset from each other, and may, for example, be electrically coupled to each other by a signal distribution structure. Additionally, any number of semiconductor dies (or other electrical components) may be utilized. FIG. 5 shows an example semiconductor device 500 that may result from such a process.

More specifically, FIG. 5 shows a cross-sectional view of an example semiconductor device 500, in accordance with various aspects of the present disclosure. It should be understood that the example device 500 may share any or all characteristics with the other examples devices discussed herein, for example, with the other example devices shown in FIGS. 2A-2J, 3, and 4.

For example, a signal distribution structure 450a may be formed, for example between blocks S5 and S6 of the example method 100 of FIG. 1. For example, after block S5, the signal distribution structure 450a may be formed on (or over) the first encapsulating material 140, the first metal pillar(s) 120, and/or the first semiconductor die 130. The signal distribution structure 450a may also be referred to as a pillar redistribution layer, a redistribution layer, a pillar redistribution structure, a trace, etc.

The signal distribution structure 450a may share any or all characteristics with the first substrate 110 and/or the second substrate 180 discussed herein. The signal distribution structure 450a may, for example, be formed in a manner that shares any or all characteristics with the forming of the first substrate 110 at block S1 and/or with the forming of the second substrate 180 at block S10. The signal distribution structure 450a may, for example, be formed to be connected to the first metal pillar(s) 120. The signal distribution structure 450a may, for example, comprise a conductive layer that laterally redistributes electrical signals to and/or from the first metal pillar(s) 120. The signal distribution structure 450a may, for example, comprise a pad layer (or other conductive layer, UBM layer, etc.) on which the second metal pillar(s) 150 may then be formed at block S6.

Note that the signal distribution structure 450a may be formed on top of the first metal pillar 120, the first semiconductor die 130, and the first encapsulating material 140. In an example implementation, the second encapsulating material 170 may be formed to cover the signal distribution structure 450a. For example, top and/or lateral side portion of the signal distribution structure 450a may be covered by the second encapsulating material 170.

Additionally, as discussed herein, a plurality of semiconductor dies may be utilized on each level of the semiconductor device (or package) instead of the single semiconductor dies, which are presented as single dies herein for illustrative clarity. As an example, the semiconductor device 500 comprises a plurality of semiconductor dies in place of the second semiconductor die 160 of other implementations.

In particular, a second semiconductor die 460 may, for example, be attached to the first semiconductor die with an adhesion member 460a, and a third semiconductor die 465 may, for example, be attached to the first semiconductor die with an adhesion member 465a. The adhesion members 460a and 465a may, for example, share any or all characteristics with the example adhesion member 160a discussed herein with regard to FIGS. 1 and 2A-2H.

The second semiconductor die 460 may, for example, comprise an active side 461 having conductive bumps that are attached to the second substrate 180, and the third semiconductor die 465 may, for example, comprise an active side 466 having conductive bumps that are attached to the second substrate 180. Such conductive bumps and/or their connection to the second substrate 180 may, for example, share any or all characteristics with other conductive bumps and/or their connections as discussed herein.

Note that, as discussed herein, the second semiconductor die 460 and third semiconductor die 465 may be laterally offset (partially or wholly) from the first semiconductor die 460. For example, the second semiconductor die 460 is attached to a top side of the first semiconductor die 130 and to a top side of the first encapsulating material 140, overhanging at least one lateral side of the first semiconductor die 130. Thus, the first encapsulating material 140 is vertically directly under a portion of the second semiconductor die 460. Also for example, the third semiconductor die 165 is positioned laterally inward from a lateral side of the first semiconductor die 130, and thus a portion of the second encapsulating material 170 is directly over a portion of the first semiconductor die 130.

In summary, various aspects of this disclosure provide a semiconductor device and a method of manufacturing a semiconductor device. As a non-limiting example, various aspects of this disclosure provide a semiconductor device comprising a stacked die structure and a method of manufacturing thereof. While the foregoing has been described with reference to certain aspects and examples, it will be understood by those skilled in the art that various changes may be made and equivalents may be substituted without departing from the scope of the disclosure. In addition, many modifications may be made to adapt a particular situation or material to the teachings of the disclosure without departing from its scope. Therefore, it is intended that the disclosure not be limited to the particular example(s) disclosed, but that the disclosure will include all examples falling within the scope of the appended claims.

What is claimed is:
1. A semiconductor device comprising:
a first substrate (S1) comprising a first signal distribution structure and a first dielectric structure, the first substrate comprising a first S1 side facing a first direction, a second S1 side facing a second direction opposite the first direction, and a lateral S1 side that extends between the first and second S1 sides;
a vertical interconnect on the first S1 side, the vertical interconnect comprising a first interconnect end facing the first direction, a second interconnect end facing the second direction and coupled to the first S1 side, and a lateral interconnect side;
a first semiconductor die (SD1) comprising a first SD1 side facing the first direction, a second SD1 side facing the second direction, and a lateral SD1 side that extends between the first and second SD1 sides;
first conductive bumps that couple the second SD1 side to the first S1 side;
a second semiconductor die (SD2) comprising a first SD2 side facing the first direction, a second SD2 side facing the second direction, and a lateral SD2 side that extends between the first and second SD2 sides, where the second SD2 side is coupled to the first SD1 side such that there is no intervening substrate between the first and second semiconductor dies;
a second substrate on the first interconnect end and on the first SD2 side, the second substrate comprising a second signal distribution structure and a second dielectric structure; and
an encapsulating material between the first substrate and the second substrate, where the encapsulating material encapsulates at least the lateral interconnect side, the lateral SD1 side, and the lateral SD2 side, and the encapsulating material contacts and covers the first dielectric structure.

2. The semiconductor device of claim 1, wherein the vertical interconnect comprises a metal post.

3. The semiconductor device of claim 1, wherein the vertical interconnect spans the first and second semiconductor dies.

4. The semiconductor device of claim 3, wherein the vertical interconnect spans the encapsulating material.

5. The semiconductor device of claim 1, wherein the vertical interconnect comprises a first part of a first metal, and a second part of a second metal on the first part.

6. The semiconductor device of claim 5, wherein the first metal comprises copper and the second metal comprises solder.

7. The semiconductor device of claim 1, wherein in a cross-section the vertical interconnect is elliptical-shaped.

8. The semiconductor device of claim 1, wherein the encapsulating material is a single unitary encapsulating material.

9. The semiconductor device of claim 1, wherein the vertical interconnect comprises an undercut between the vertical interconnect and the first substrate, and a portion of the encapsulating material is positioned in the undercut.

10. The semiconductor device of claim 1, comprising an adhesive that directly contacts the second SD2 side and the first SD1 side.

11. The semiconductor device of claim 1, comprising an adhesive that couples the second SD2 side to the first SD1 side, wherein a portion of the first SD1 side is exposed from the adhesive.

12. The semiconductor device of claim 1, wherein the second SD1 side comprises an active side, and the first SD2 side comprises an active side.

13. The semiconductor device of claim 12, comprising an adhesive that comprises a first adhesive side coupled to the second SD2 side, a second adhesive side coupled to the first SD1 side, and a lateral adhesive side that extends between the first and second adhesive sides, and wherein the encapsulating material directly contacts the lateral SD1 side, the lateral SD2 side, and the lateral adhesive side.

14. The semiconductor device of claim 1, comprising an underfill material distinct from the encapsulating material and positioned directly between the first semiconductor die and the first substrate, and wherein there is no underfill material positioned directly between the second semiconductor die and the second substrate.

15. The semiconductor device of claim 1, comprising a conductive ball on the first S2 side and positioned laterally within a footprint of the first semiconductor die and a footprint of the second semiconductor die.

16. A method of manufacturing a semiconductor device, the method comprising:

providing a first substrate (S1) comprising a first signal distribution structure and a first dielectric structure, the first substrate comprising a first S1 side facing a first direction, a second S1 side facing a second direction opposite the first direction, and a lateral S1 side that extends between the first and second S1 sides;

forming a vertical interconnect on the first S1 side, the vertical interconnect comprising a first interconnect end facing the first direction, a second interconnect end facing the second direction and coupled to the first S1 side, and a lateral interconnect side;

providing a first semiconductor die (SDI) comprising a first SD1 side facing the first direction, a second SD1 side facing the second direction, and a lateral SD1 side that extends between the first and second SD1 sides;

utilizing first conductive bumps to couple the second SD1 side to the first S1 side;

providing a second semiconductor die (SD2) comprising a first SD2 side facing the first direction, a second SD2 side facing the second direction, and a lateral SD2 side that extends between the first and second SD2 sides;

coupling the second SD2 side to the first SD1 side such that there is no intervening substrate between the first and second semiconductor dies;

forming a second substrate on the first interconnect end and on the first SD2 side, the second substrate comprising a second signal distribution structure and a second dielectric structure; and forming an encapsulating material between the first substrate and the second substrate, where the encapsulating material encapsulates at least the lateral interconnect side, the lateral SD1 side, and the lateral SD2 side, and the encapsulating material contacts and covers the first dielectric structure.

17. The method of claim 16, wherein said forming the encapsulating material is performed after said forming the vertical interconnect.

18. The method of claim 16, wherein the vertical interconnect spans the first semiconductor die, the second semiconductor die, and the encapsulating material.

19. The method of claim 16, wherein the vertical interconnect comprises a first part comprising copper and a second part comprising solder.

20. The method of claim 16, comprising forming an adhesive that comprises a first adhesive side coupled to the second SD2 side, a second adhesive side coupled to the first SD1 side, and a lateral adhesive side that extends between the first and second adhesive sides, and wherein the encapsulating material directly contacts the lateral SD1 side, the lateral SD2 side, and the lateral adhesive side.

* * * * *